(12) United States Patent
Posseme (10) Patent No.: US 9,679,802 B2
(45) Date of Patent: Jun. 13, 2017

(54) METHOD OF ETCHING A POROUS DIELECTRIC MATERIAL

(71) Applicant: COMMISSARIAT A L'ENERGIE ATOMIQUE ET AUX ENERGIES ALTERNATIVES, Paris (FR)

(72) Inventor: Nicolas Posseme, Grenoble (FR)

(73) Assignee: COMMISSARIAT A L'ENERGIE AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/661,371

(22) Filed: Mar. 18, 2015

(65) Prior Publication Data

US 2015/0270163 A1    Sep. 24, 2015

(30) Foreign Application Priority Data

Mar. 18, 2014   (FR) ...................... 14 52221

(51) Int. Cl.
  *H01L 21/311*  (2006.01)
  *H01L 21/768*  (2006.01)
  *H01L 21/02*   (2006.01)

(52) U.S. Cl.
  CPC .. *H01L 21/76802* (2013.01); *H01L 21/02126* (2013.01); *H01L 21/31116* (2013.01);
  (Continued)

(58) Field of Classification Search
  CPC ......... H01L 21/76807; H01L 21/76831; H01L 21/76802; H01L 21/76826;
  (Continued)

(56) References Cited

U.S. PATENT DOCUMENTS 6,346,490 B1 *  2/2002  Catabay ............ H01L 21/31116
                                                        257/E21.252
6,514,855 B1 *  2/2003  Shioya ............ H01L 21/02063
                                                        257/E21.577

(Continued)

FOREIGN PATENT DOCUMENTS

EP    1 233 449 A2    8/2002

OTHER PUBLICATIONS

French Preliminary Search Report and Written Opinion issued Jan. 30, 2015, in Patent Application No. FR 1452221, filed Mar. 18, 2014 (with English Translation of Category of Cited Documents).

(Continued)

*Primary Examiner* — Marvin Payen
*Assistant Examiner* — Jeremy Joy
(74) *Attorney, Agent, or Firm* — Oblon, McClelland, Maier & Neustadt, L.L.P.

(57) ABSTRACT

A method for producing interconnection lines including etching a layer of porous dielectric material forming a trench and filling the trench is provided. The etching is carried out in a plasma so as to grow, all along the etching, a protective layer on flanks of the layer of porous dielectric material. The plasma is formed from a gas formed from a first component and a second component, or a gas formed from a first component, a second component and a third component. The first component is a hydrocarbon of the CXHY type, where X is the proportion of carbon in the gas and Y the proportion of hydrogen in the gas; the second component is taken from nitrogen or dioxygen or a mixture of nitrogen and dioxygen; the third component is taken from argon or helium; and the protective layer is based on hydrocarbon.

19 Claims, 7 Drawing Sheets

(52) U.S. Cl.
CPC .. *H01L 21/31144* (2013.01); *H01L 21/76811* (2013.01); *H01L 21/76826* (2013.01); *H01L 21/76829* (2013.01); *H01L 21/76831* (2013.01)

(58) Field of Classification Search
CPC ......... H01L 21/31138; H01L 21/76829; H01L 21/02063; H01L 21/02126; H01L 21/76843; H01L 23/52; H01L 23/522; H01L 23/5226
See application file for complete search history.

(56) References Cited

U.S. PATENT DOCUMENTS

| | | | | |
|---|---|---|---|---|
| 6,828,247 | B2* | 12/2004 | Nakagawa | H01L 21/31138 257/E21.256 |
| 6,962,869 | B1* | 11/2005 | Bao | H01L 21/3105 257/E21.576 |
| 7,135,402 | B2* | 11/2006 | Lin | H01L 21/76831 257/E21.576 |
| 2001/0046781 | A1* | 11/2001 | Nakagawa | H01L 21/31138 438/725 |
| 2002/0173142 | A1* | 11/2002 | Vanhaelemeersch | H01L 21/31138 438/637 |
| 2004/0028916 | A1* | 2/2004 | Waldfried | C01B 33/126 428/447 |
| 2005/0167839 | A1* | 8/2005 | Wetzel | H01L 21/76802 257/758 |
| 2006/0128163 | A1* | 6/2006 | Chen | H01L 21/3105 438/780 |
| 2006/0172530 | A1* | 8/2006 | Cheng | H01L 21/312 438/637 |
| 2008/0261405 | A1* | 10/2008 | Yang | H01L 21/02063 438/711 |
| 2010/0003820 | A1* | 1/2010 | Iba | H01L 21/31116 438/675 |
| 2011/0287227 | A1* | 11/2011 | Moser | B81C 1/00206 428/164 |
| 2013/0149461 | A1* | 6/2013 | Dordi | C23C 18/2086 427/534 |
| 2014/0061926 | A1* | 3/2014 | Han | H01L 21/7682 257/760 |
| 2014/0175617 | A1* | 6/2014 | Antonelli | H01L 21/02112 257/632 |

OTHER PUBLICATIONS

Hideo Nakagawa, et al., "$CH_4/N_2$ Plasma Etching for Organic Low-*k* Dielectric Material", Japanese Journal of Applied Physics, vol. 41, Pt. 1, No. 9, XP 001163821, Sep. 2002, pp. 5775-5781.

N. Possémé, et al., "A Novel Low-Damage Methane-Based Plasma Ash Chemistry ($CH_4$/Ar): Limiting Metal Barrier Diffusion into Porous Low-*k* Materials", Electrochemical and Solid-State Letters, vol. 8, No. 5, XP 055165357, 2005, pp. G112-G114.

N. Posseme, et al., "Etching of porous SiOCH materials in fluorocarbon-based plasmas", J. Vac. Sci. Technol. B, vol. 22, No. 6, Nov./Dec. 2004, pp. 2772-2784.

N. Posseme, et al., "Mechanisms of porous dielectric film modification induced by reducing and oxidizing ash plasmas", J. Vac. Sci. Technol. B, vol. 25, No. 6, Nov./Dec. 2007, pp. 1928-1940.

N. Posseme, et al., "Residue growth on metallic-hard mask after dielectric etching in fluorocarbon-based plasmas. I. Mechanisms", J. Vac. Sci. Technol. B, vol. 28, No. 4, Jul./Aug. 2010, pp. 809-816.

N. Posseme, et al., "Residue growth on metallic hard mask after dielectric etching in fluorocarbon based plasmas. II. Solutions", J. Vac. Sci. Technol. B, vol. 29, No. 1, Jan./Feb. 2011, 10 pages.

\* cited by examiner

METHOD OF ETCHING A POROUS DIELECTRIC MATERIAL

FIELD OF THE INVENTION

The present invention relates to the use of porous dielectric materials with low permittivity for producing electrical interconnection lines for microelectronic devices and in particular in integrated circuits. It relates more particularly to an improved method for etching such materials.

TECHNOLOGICAL BACKGROUND

In order to reap the requirements for size of the devices and switching times in microelectronics, the method for producing interconnection lines, said lines requiring insulation by a porous dielectric material, has had to be adapted. Furthermore, producing narrow trenches in the porous dielectric material, SiOCH for example, requires reviewing the various plasma methods (etching, post-etching treatments) and integration schemes, since this material is known to be easily degraded when it is exposed to a plasma based on fluorine in particular. The studies carried out to evaluate the efficacy of various plasmas according to the materials exposed to the plasmas make it possible to characterise and optimise the methods for transferring patterns of a metallic or organic mask in an SiOCH that is porous or hybrid (made porous at the end of integration). One major problem is the modification of porous and hybrid dielectric materials during "post-etching" plasma. With a fluorocarbon plasma, the hybrid material exhibits etching mechanisms similar to those of a dense SiOCH. The material of the titanium nitride (TiN) type and the organic material have etching mechanisms different from those of dielectrics, which ensures good selectivity. The optimised etching method for the organic mask allows the etching of very narrow trenches with an almost vertical profile.

During the method for producing interconnection lines, one of the critical steps remains the etching of the layer of porous dielectric material. The main drawback of a plasma etching based on fluorine in a device comprising a metal hard mask and a layer of porous dielectric material is the generation of residues resulting from the interaction between the chemical species present in the plasma and on the metal mask; said residues are deposited on the layers and consequently cause failures of the devices produced. This phenomenon of the formation of residues during plasma etching based on fluorine and carbon is in particular described in the publication in English: "Residue growth on metallic-hard mask after dielectric etching in fluorocarbon-based plasmas. I. Mechanisms", N. Posseme et al, J. Vac. Sci. Technol. B 28(4), July/August 2010, pp. 809-816.

Other drawbacks of plasma etching based on fluorine are mentioned below and illustrated in FIGS. 1a to 1c. These figures depict in particular the various problems caused by the etching of the porous dielectric, p-SiOCH, using a fluorocarbon plasma and by the use of a hard mask of titanium nitride (TiN).

Figure 1A:
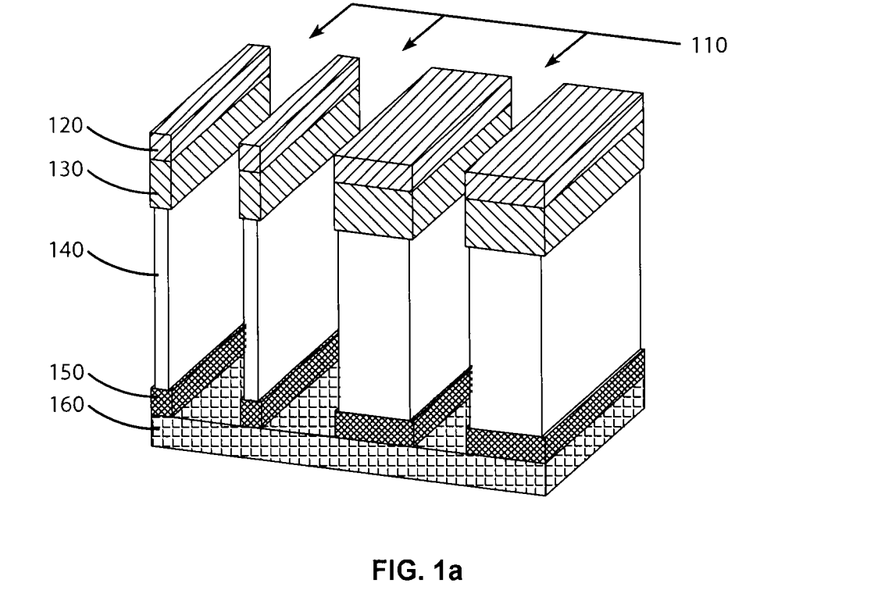
FIGS. 1a to 1c illustrate the various problems caused by the etching of the porous dielectric material, for example p-SiOCH, using a fluorocarbon plasma.

FIG. 1a illustrates the structure of the interconnection lines after etching in a fluorocarbon plasma of the porous material used as a dielectric material, p-SiOCH, and before filling of the trenches 110, as implemented in the conventional so-called "damascene" method of formation of the copper interconnections.

The etching is done using a hard mask 120, typically made from titanium nitride (TiN), which covers a layer 130 of silicon oxide ($SiO_2$) serving as a stop layer during the chemical mechanical polishing (CMP) step with a view to the subsequent production of interconnection lines based on copper, for example with the "damascene" method. Prior to the depositing of the layer 130 of silicon oxide, a layer of porous dielectric material 140 is formed, for example SiOCH. Under the layer of porous dielectric material 140 is a layer 150 serving as a stop layer during the plasma etching. The global layer 160 represents all the underlying layers of the integrated circuit, in particular those containing active components that are produced during the preliminary steps of the methods, those that precede the so-called "BEOL" (back-end of line) operations during which, at relatively low temperatures, all the levels of interconnections between the active components are produced and where all the dielectric layers will be etched successively.

FIG. 1a illustrates a first problem related to the greater sensitivity of the porous dielectric material 140 during the conventional etching in a fluorocarbon plasma. A greater consumption of the porous dielectric material 140 is observed, corresponding to an over-etching of this layer 140. Moreover, problems of absorption of moisture are also encountered, which could give rise to an increase in the dielectric constant of the low-permittivity dielectric material; which runs counter to the aim sought and also affects the reliability of the device produced.

Figure 1B:
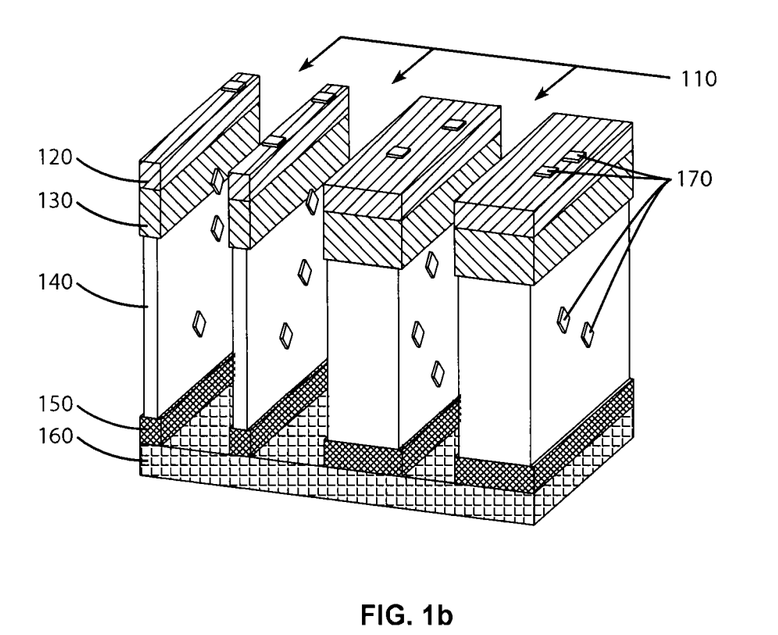

FIG. 1b illustrates an additional problem that relates to the use of a metal hard mask 120. After etching, the trenches 110 are inevitably exposed to free air, causing a deposition and a formation of residues 170 on the walls of the trenches 110. The formation of these residues 170 is all the greater, the to longer the trenches 110 are left in free air. The mechanism of formation of the residues 170 is associated with the fluorinated species present on the hard metal hard mask 120 and on the surfaces of the low-permittivity porous dielectric material 140, after etching in the fluorocarbon plasma. The fluorinated species then react with the moisture in the air, producing hydrofluoric acid (HF), which forms metal salts in contact with the hard mask 120. These residues 170 affect the quality of the following depositions: that of the layer forming a barrier to the diffusion of copper, and that of the layer of copper that will serve to form all the metal interconnection lines (the use of copper requires the prior deposition of a layer intended to prevent the diffusion of it in the semiconductor material used for producing transistors, generally made from silicon). These residues 170 may produce unwanted vias between lines (for example short-circuits) and line ruptures (for example open circuits) that very significantly affect the manufacturing yield of the devices produced.

Figure 1C:
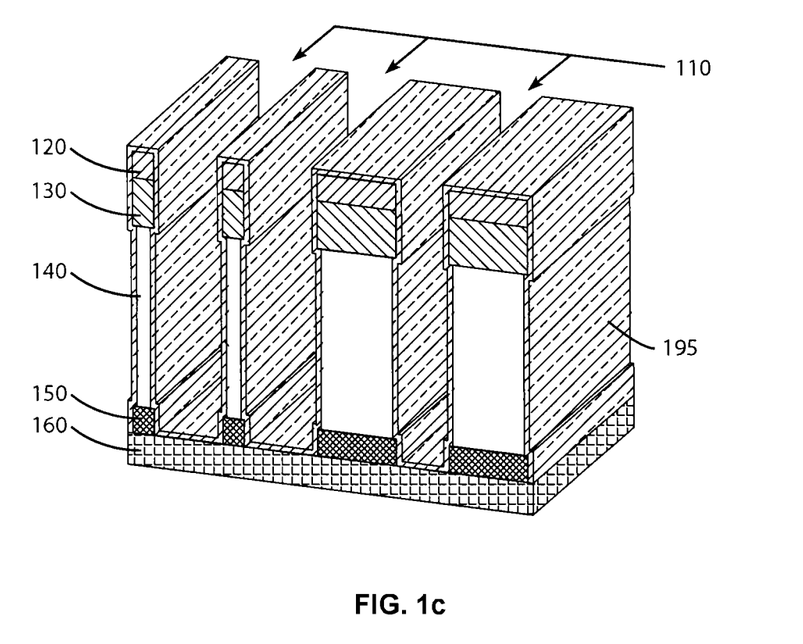

FIG. 1c illustrates yet another problem that is related to wet cleaning based on the use of hydrofluoric acid (HF) and which proves not to be sufficiently effective to eliminate all the fluorocarbon layer formed during etching. After wet cleaning, fluorine remains on the flanks of the trenches 110. The fluorine is encapsulated during the deposition of the layer 195 serving as a metal barrier and which must be deposited before the deposition of copper to prevent the migration of the latter. The fluorine has a tendency to diffuse and may lead to a degradation in reliability of the porous dielectric material 140, for example a p-SiOCH. An aggressive wet cleaning, which would remove all of the fluorine layer, would have the drawback of leading to a loss of definition of the critical dimensions of the devices produced.

Consequently, introducing low-permittivity porous dielectric materials necessary for reducing the time constant of the interconnections between active components of an integrated circuit, and in particular etching these porous dielectric materials in a fluorocarbon plasma, pose numerous problems.

One subject matter of the present invention proposes a method for producing interconnection lines limiting, or even eliminating, at least some of the problems and drawbacks mentioned above, and in particular the problems generated during the step of etching porous dielectric materials using a plasma based on fluorocarbon compounds.

SUMMARY OF THE INVENTION

The present invention concerns a method for producing interconnection lines comprising at least one step of etching a layer of porous dielectric material forming a trench and a step of filling said trench. The etching is carried out in a plasma so as to grow, all along said etching, a protective layer at least on the flanks of the layer of porous dielectric material. Advantageously, the plasma is formed from a gas formed from a first component and a second component, or a gas formed from a first component, a second component and a third component. The first component is a hydrocarbon of the $C_XH_Y$ type, where X is the proportion of carbon in the gas and Y the proportion of hydrogen (H) in the gas; the second component is taken from nitrogen ($N_2$) and dioxygen ($O_2$) or a mixture of nitrogen and dioxygen; the third component is taken from argon (Ar) or helium (He).

Particularly advantageously, the etching step of the method according to the invention makes it possible to form a trench, the flanks and bottom of which are devoid of residues. Thus, during the step of filling the trenches, limiting residual deposits on the flanks improves the conduction quality of the filling material and thereby promotes the reliability of the interconnection lines.

The etching is preferably carried out using a plasma comprising at least one hydrocarbon-based gas. Advantageously, all the compounds of the $C_XH_Y$ type, where X is the proportion of carbon and Y the proportion of hydrogen, are able to suit. Preferably, the gas forming the plasma comprises methane ($CH_4$).

Particularly advantageously, the protective layer based on hydrocarbon that develops during etching protects the porous dielectric material from any contamination or modification.

Preferably, the mixture of gas forming the plasma also comprises nitrogen ($N_2$) or oxygen ($O_2$). In addition, the nitrogen makes it possible to etch the porous dielectric material and to control the quantity of carbon deposited on the flanks.

The invention relates to a method for producing an electrical interconnection line. The method comprises the etching of a pattern forming a trench according to the steps of the invention. It also preferably comprises a subsequent step of filling the trench with an electrically conductive material.

The invention is however not limited to the production of interconnection lines between the active components of an integrated circuit, for example transistors. It is suitable whenever it is necessary to etch a porous material of the SiOCH type. For example, transistor gate spacers, which are currently produced from silicon nitride, can also be made from porous SiOCH in order to reduce the stray capacitances between the gate and the other electrodes of the transistor, that is to say the source and the drain.

Thus, according to a non-limitative embodiment, the pattern forms a trench. According to another non-limitative embodiment, the pattern can serve to remove the layer of porous dielectric material outside the flanks of the gate in order to leave spacers in place.

According to one option, the etching defines a pattern in the layer of porous dielectric material and comprises, prior to the etching, the definition of the pattern in a mask surmounting the layer of porous dielectric material, the etching of the layer of porous dielectric material then being carried out through the mask.

According to another embodiment, the invention relates to a method for etching at least one pattern in a layer of porous dielectric material. The method comprises: the definition of the pattern in a mask surmounting the layer of porous dielectric material, and at least one etching of the layer of porous dielectric material through the mask. The etching is carried out, preferably, in a plasma comprising a gas based on hydrocarbon and nitrogen ($N_2$) or oxygen ($O_2$), so as to form a protective layer all along said etching, at least on the flanks of the layer of porous dielectric material.

The aim of the invention is to develop a method for producing interconnection lines also comprising a step of chemical etching of a layer of porous dielectric material forming a trench. Advantageously, this etching step reduces or even eliminates damage and/or the formation of residues on the front of the layer of porous dielectric material.

Advantageously, the formation of a protective layer on the flanks of the layer of porous dielectric material enables the porous dielectric material to keep its electrical properties and in particular low permittivity. Particularly advantageously, limiting residual deposits and forming a protective layer on the flanks of the layer of porous dielectric material make it possible to promote the conduction of the filling material and thus improve the reliability of the interconnection lines.

According to another embodiment, the present invention relates to a method for etching a layer of porous dielectric material. The etching is carried out in a plasma so as to grow, all along said etching, a protective layer at least on the flanks of the layer of porous dielectric material. Advantageously, the plasma is formed from a gas formed from a first component and a second component, or a gas formed from a first component, a second component and a third component. The first component is a hydrocarbon of the $C_XH_Y$ type, where X is the proportion of carbon in the gas and Y the proportion of hydrogen (H) in the gas; the second component is taken from nitrogen ($N_2$) and dioxygen ($O_2$) or a mixture of nitrogen and dioxygen; the third component is taken from argon (Ar) or helium (He).

BRIEF INTRODUCTION OF THE FIGURES

The aims, objects, features and advantages of the invention will emerge more clearly from the detailed description of an embodiment thereof that is illustrated by the following accompanying drawings, wherein.

The drawings are given by way of examples and are not limitative of the invention. They constitute schematic outline representations intended to facilitate understanding of the invention and are not necessarily to the scale of practical applications. In particular, the relative thicknesses of the various layers and films are not representative of reality.

DETAILED DESCRIPTION

In the context of the present invention, the term "on" or "underlying" does not necessarily mean "in contact with". Thus, for example, depositing a first layer on a second layer does not necessarily mean that the two layers are directly in contact with each other but means that the first layer at least partially covers the second layer while being either directly in contact therewith or being separated therefrom by another layer or another element.

In the following description, the thicknesses are generally measured in directions perpendicular to the plane of the bottom face of the layer to be etched or of a substrate on which the bottom layer is disposed. Thus the thicknesses are generally taken in a vertical direction on the figures depicted. On the other hand, the thickness of a layer covering a flank of a pattern is taken in a direction perpendicular to this flank.

Before beginning a detailed review of embodiments of the invention, optional features, which may optionally be in association or alternatively, are stated below:

According to a particularly advantageously embodiment, the ratio of gas between the first component and the second component is between 5% and 20%.

According to a particularly advantageous embodiment, the ratio of gas between the first component and the second component is greater than 1:20 and less than 1:10. The risk of using a gas-mixture ratio, for example of methane/nitrogen, greater than 1:10 is preventing the etching of the porous dielectric material. The risk of using a gaseous-mixture ratio, for example of methane/nitrogen, of less than 1:20 is modifying the porous dielectric material. Typically the ratio is a ratio of the flow rate of the first component to the flow rate of the second component. These flow rates may be expressed in sccm, the acronym for standard cubic centimeters per minute.

Preferentially, the hydrocarbon-based gas is taken from methane ($CH_4$).

Advantageously, the plasma comprises nitrogen ($N_2$). The porous dielectric film is etched following the nitrogen-based ion bombardment.

According to one embodiment, the plasma comprises dioxygen ($O_2$).

Advantageously, the plasma also comprises argon (Ar) or helium (He).

Preferably, in order to adjust the thickness of the protective layer, the concentration of hydrocarbon forming the plasma is modified. Typically, the concentration of hydrocarbon forming the plasma is increased so as to increase the thickness of the protective layer. It is necessary however not to have an excessively high concentration in order not to prevent etching.

Particularly advantageously, the hydrocarbon-based protective layer formed during the etching electrically insulates the flanks of the porous dielectric material.

Advantageously, the protective layer formed during the etching is preserved. According to one embodiment, an additional layer is deposited on the protective layer in order to form interconnections.

Preferentially, the porous dielectric material is a porous silicon oxide doped with carbon and hydrogen (SiOCH).

Advantageously, before the etching of the layer of porous dielectric material, a hard mask surmounting the layer of porous dielectric material is produced, the hard mask having at least one pattern and the layer of porous dielectric material being etched through the hard mask in order to transfer the pattern into the layer of porous dielectric material.

Preferably, the hard mask is made from silicon oxide ($SiO_2$), silicon nitride (SiN) or dense SiOCH.

Advantageously, the hard mask has a bottom face in contact with the layer of porous dielectric material and a top face opposite to the bottom face and wherein said top face is in contact with the etching solution during the step of etching the layer of porous dielectric material through the hard mask.

Advantageously, the thickness of the hard mask is adapted so as to not be entirely consumed during the plasma etching of the layer of porous dielectric material.

Preferentially, the hard mask is a metal mask.

Advantageously, prior to defining the pattern in the hard mask, a stop layer is disposed under the layer of porous dielectric material, conformed so as to stop the etching of the layer of porous dielectric material, and a step of etching the stop layer is carried out after the step of etching the layer of porous dielectric material.

According to one embodiment, prior to defining the pattern of the hard mask, there is disposed under the layer of porous dielectric material a stop layer which, when it is subjected to the plasma used for etching the layer of porous dielectric material, has an etching rate lower than the etching rate of the layer of porous dielectric material, and wherein the stop layer is etched following the etching of the layer of porous dielectric material using said plasma.

Advantageously, the pattern is a trench, the method comprising, after the etching of the layer of porous dielectric material, a subsequent step of filling the trench with an electrically conductive material.

Preferably, the trench forms an electrical interconnection line.

Advantageously, before the etching step, the porous dielectric material covers a gate of a transistor and the etching is performed anisotropically in a principal direction parallel to the flanks of the gate, so as to remove the layer of porous dielectric material only outside the flanks of the transistor in order to form spacers for the gate.

Figure 2:
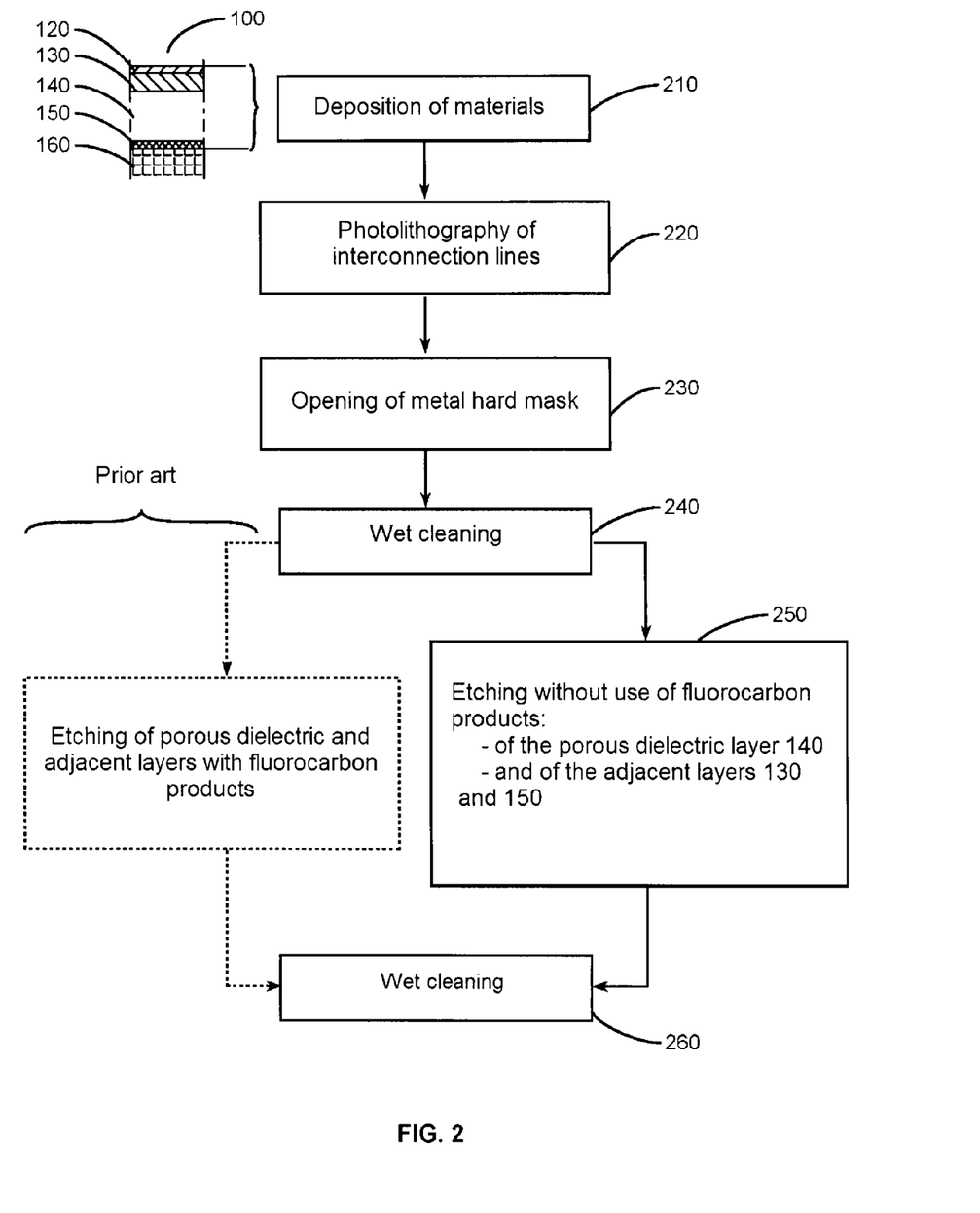
FIG. 2 summarises the main steps of the method of the invention and the differences from the standard method of etching the porous dielectric material, in order to form trenches therein.

FIG. 2 summarises the steps of etching the porous dielectric material 140 according to the method of the invention and emphasises the differences from the standard method.

First of all the various layers of material, including the layer of porous dielectric material 140 wherein the interconnection lines will be etched, are first of all deposited 210. The various layers already described are found, which are, in the order wherein they are deposited: the layer 150 serving as a stop layer for the etching, the layer of porous dielectric material 140, the layer of oxide 130, the metal hard mask 120. In this layered structure 100, the global layer 160 or stack of layers represents all the underlying layers wherein the active components, that is to say the transistors, were previously produced.

Advantageously but non-limitatively, the thicknesses and materials of the above layers are:

The metal hard mask 120 is preferably formed from silicon nitride (SiN), in a range of thicknesses of between 5 and 100 nanometers (nm) and, preferably, between 10 and 50 nm. In the context of the present invention, the metal hard mask 120 may also be produced from tantalum nitride (TaN) or boron nitride (BN).

The layer 130 of oxide is preferably based on silicon oxide ($SiO_2$), in a range of thicknesses from 10 to 50 nm. It serves as a stop layer for the chemical mechanical polishing (CMP) step that is performed when interconnections are formed with the "damascene" method.

The layer of porous dielectric material 140 is preferentially formed from porous SiOCH. Its thickness is between 50 and 120 nm. This layer may be deposited by centrifugation, an operation that is generally referred to as "spin coating", that is to say a deposition by spreading using a "spinner". The SiOCH is deposited in liquid form on the rotating wafer and in its final porous form. It is also possible to proceed by dry method with a plasma-enhanced chemical vapour deposition (PECVD). The deposition is then done in two steps using two precursor gases: one for generating the dense matrix of porous dielectric material SiOCH, the other to form the porogenic structure wherein the proportion by volume of pores can be varied. In both cases, the porosity of the dielectric material 140 is preferably between 10% and 50% so as to ensure good efficacy of the etching. The chemistry of the etching of the invention is not limited to the porous dielectric material SiOCH. It can also be practised with other materials such as silicon oxide ($SiO_2$) and silicon nitride (SiN).

The etching stop layer 150 typically has a thickness ranging from 10 to 20 nm. It may consist of the following materials used in a standard fashion for the back-end of line (BEOL) operations: silicon carbide (SiCH), silicon nitride (SiN) or silicon carbonitride (SiCN). The stop layer 150 advantageously fulfils a protective role preventing contamination of the porous dielectric material 140 with contaminating materials such as copper, which are present in the lower layers, that is to say in the layers underlying the global layer 160.

The following step 220 consists of defining, by conventional photolithography, using a photosensitive resin, the interconnection-line patterns that will have to be etched in the layer of porous dielectric material 140. To do this, use is made of a metal hard mask 120. The patterns are first of all transferred into the layer 120 generally formed from titanium nitride (TiN). The patterns defined in the layer of resin (not shown) are therefore opened at the following step 230 in this layer. The use of a hard mask is optional in the context of the present invention. These steps are followed by a wet cleaning step 240.

The invention differs essentially from the standard method in that the etching of the layer 130 made from $SiO_2$, the layer of porous dielectric material 140 made from porous SiOCH and the stop layer 150, which is produced at the following step 250, is done without using fluorinated products.

As will be explained subsequently, the etching of the layer of porous dielectric material 140 made for example from SiOCH in a plasma based on hydrocarbon and nitrogen ($N_2$) and/or oxygen ($O_2$) is carried out; the plasma advantageously being free from any fluorinated compound. Preferably, and in the following example, the plasma comprises solely a hydrocarbon, nitrogen and, optionally but advantageously, argon (Ar) or helium (He).

In both cases, the etching operation may be followed by a new wet cleaning step 260 necessary for removing all the impurities present on the surface.

FIGS. 3a to 3h detail the steps of the method of the invention.

Figure 3A:
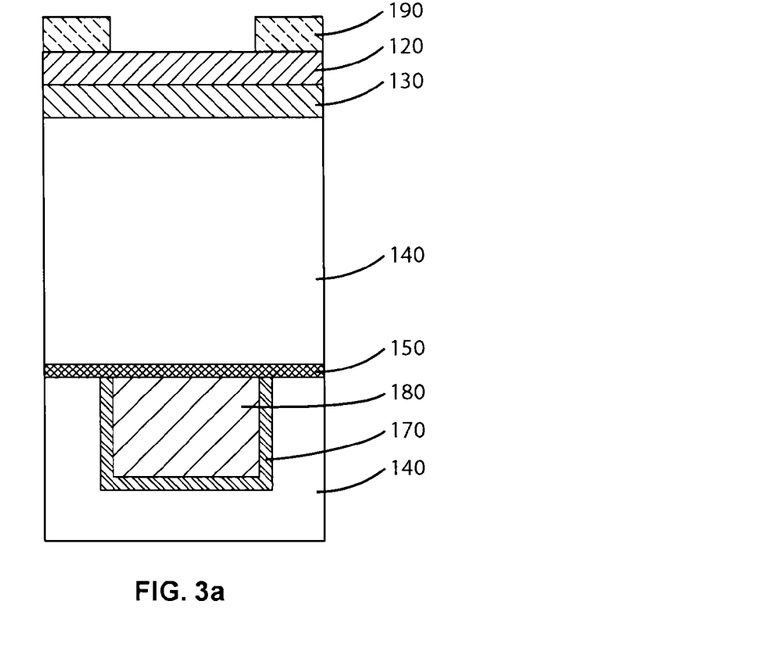
FIGS. 3a to 3h illustrate the various steps of the method of the invention with a view to producing interconnection lines.

FIG. 3a is a view in cross-section of a device comprising a first interconnection line at a first level N−1. This first interconnection line is preferably formed from a metal material 180. The metal material is preferably copper. According to an advantageous embodiment, the metallization line is protected by an antidiffusion layer 170. This antidiffusion layer 170 acts as a barrier layer to the diffusion of the metal material 180 forming the interconnection line. This antidiffusion layer comprises, for example, a dual layer of titanium and titanium nitride, preferably deposited by a vapour deposition technique. This first level N−1 is insulated by a stop layer 150 covered with a new layer of porous dielectric material 140 forming a second level N. This stop layer 150 advantageously fulfils a protective role preventing contamination of the porous dielectric material 140 of the second level N with contaminating materials such as copper, which are present in the first level N−1, for example. The stop layer 150 may be formed from materials such as silicon nitride (SiN), nitrided silicon carbide (SiCN), etc.

In order to produce a second interconnection line at the second level N, from the layer of porous dielectric material 140, a series of steps is required. First of all a layer of oxide 130 is formed on the layer of porous dielectric material 140. Next a layer forming the metal hard mask 120 is produced. In order to form a pattern through respectively the hard mask 120, the layer of oxide 130 and the layer of porous dielectric material 140, a preliminary lithography step is performed, comprising a step of forming a layer 190, preferably of resin, on the metal hard mask 120.

Figure 3B:
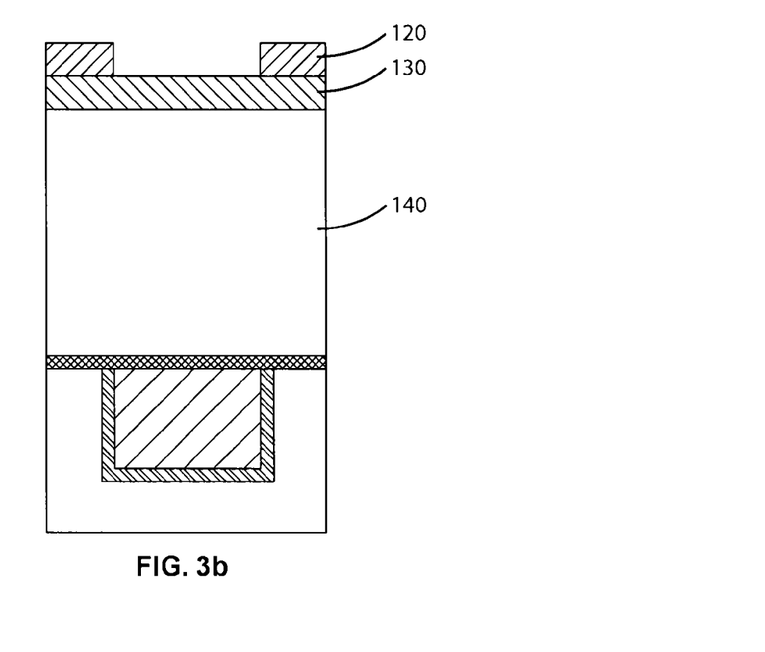

FIG. 3b illustrates the step of partial etching of the hard mask 120. According to a non-limitative example embodiment of the invention, the titanium nitride (TiN) forming the hard mask 120 is removed selectively by chemical etching based on chlorine ($Cl_2$) in equipment dedicated to the etching of the metal wherein a chlorinated plasma is formed. Selective etching of the layer means the removal of said layer only at the patterns defined by the previous lithography step, so as to reach a lower layer.

Figure 3C:
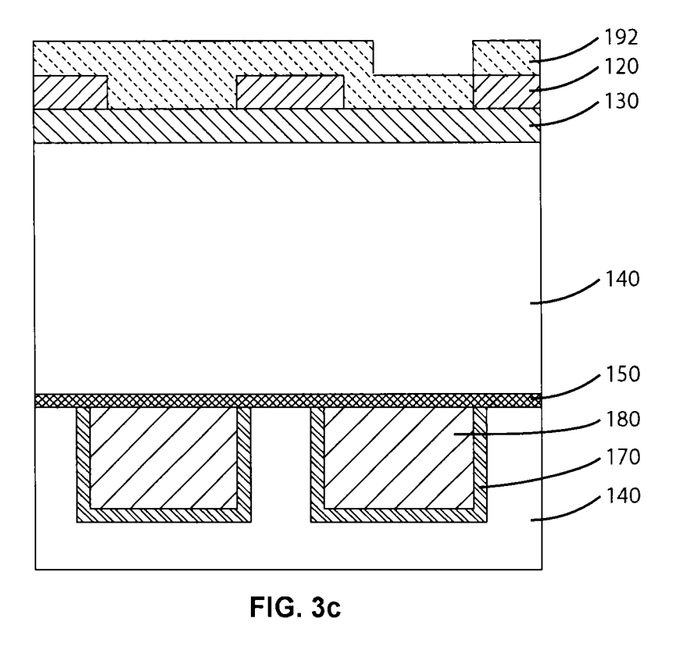

FIG. 3c illustrates a new lithography step consisting of the definition of a pattern defining a trench. According to this embodiment, a layer 192, preferably of resin, is deposited at the end of the step of etching the hard mask 120. The pattern is preferentially formed at the patterns defined by the previous lithography step.

Figure 3D:
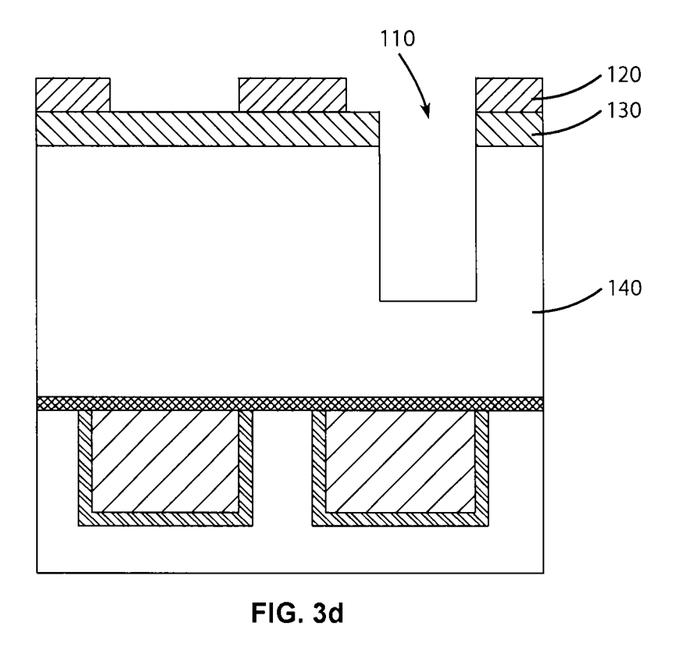

FIG. 3d illustrates the result of the step of etching the layer of oxide 130, preferably silicon dioxide ($SiO_2$), and the layer of porous dielectric material 140, so as to form an opening 110 through the layer of oxide 130 and the layer of porous dielectric material 140.

The etching of the layer of oxide 130 can be carried out by means of fluorocarbon chemistry. Unlike the conventional method, with the invention the etching of the layer of porous dielectric material 140 made for example from SiOCH is carried out in a plasma based on hydrocarbon and nitrogen ($N_2$) and/or oxygen ($O_2$); said plasma advantageously being free from any fluorinated compound. Preferably, and in the following example, the plasma comprises solely a hydrocarbon, nitrogen and, optionally but advantageously, argon (Ar) or helium (He).

Advantageously, this is physicochemical etching, using both an ion bombardment and a chemical reaction between the ionised gas (plasma) and the surface exposed to the ion bombardment. The role of the nitrogen ($N_2$) is also to etch the porous SiOCH film.

The hydrocarbon-based gas used during the plasma etching advantageously forms a protective envelope at least on the flanks of the layer of porous dielectric material 140, leaving a protective layer at least on said flanks and the bottom.

At the end of this etching, an opening 110 is formed through the layer of oxide 130 and the layer of porous dielectric material 140. The layer of resin 192 previously deposited serves as a protective mask for the regions that were not intended to be etched, locating the removal of said layers 130, 140 solely at the patterns defined by the previous lithography step. A step of removing the layer of resin 192 follows. The removal of the layer of resin 192 is, for example, performed using a plasma etching by means of species present in the reactor such as oxygen ($O_2$). When the layer of resin 192 is removed, the protective layer formed at least on the flanks and the bottom of the opening 110 is removed.

Figure 3E:
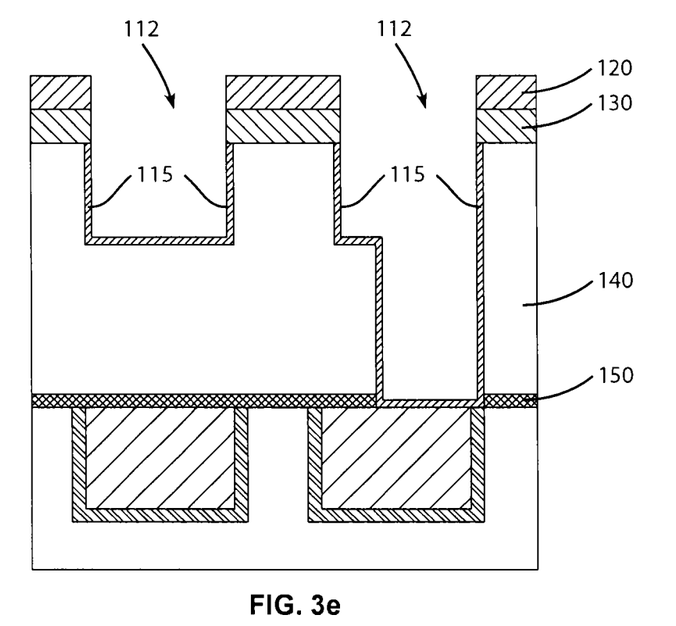

FIG. 3e illustrates the result of the step of etching the layer of oxide 130 and the layer of porous dielectric material 140. As indicated below, the chemistry of the etching of the layer 130 of $SiO_2$ and the layer of porous dielectric material 140 may, according to a particular embodiment, also etch the stop layer 150.

As before, the etching of the layer of oxide 130 can be carried out by means of a fluorocarbon chemistry. The etching is then carried out of the layer of porous dielectric material 140 made for example from SiOCH, in a plasma based on hydrocarbon and nitrogen ($N_2$) and/or oxygen ($O_2$); said plasma advantageously being free from any fluorinated compound. Preferably, and in the following example, the plasma comprises solely a hydrocarbon, nitrogen and, optionally but advantageously, argon (Ar) or helium (He).

Advantageously, this is a physicochemical etching, involving both an ion bombardment and a chemical reaction between the ionised gas (plasma) and the surface exposed to the ion bombardment. The role of the nitrogen ($N_2$) is also to etch the film of porous SiOCH.

The hydrocarbon-based gas used during the plasma etching advantageously forms a protective envelope at least on the flanks of the layer of porous dielectric material 140, leaving a protective layer 115 at least on said flanks and the bottom.

The hydrocarbon-based protective layer 115 is obtained from a plasma consisting partly of hydrocarbon. Hydrocarbon means organic compounds consisting mainly of carbon and hydrogen. The hydrocarbons that can be used in the invention are those in the series of alkanes, alkenes and alkines. In particular, these hydrocarbons may be saturated or unsaturated. Hydrocarbons that can be used in the invention include acetylene, propadiene, ethylene, butane, propylene, methane, ethane, butane and propane. Preferably, methane is chosen. According to the invention, a hydrocarbon or a mixture of hydrocarbons can be used.

During this operation, there is therefore a formation of a protective layer 115 on the flanks and bottom of the trench 112. The formation of the protective layer 115 is assisted by the fact that the nitrogen-based ion bombardment on the flanks of the patterns is weak whereas, on the other hand, on the bottom of the patterns, the bombardment delays the formation of this layer. This nitrogen-based ion bombardment is anisotropic, thus effectively etching the porous dielectric 140 whilst keeping a high aspect ratio.

Although, in a preferred embodiment, the etching chemistry is the same for the layer of porous dielectric material 140 and the stop layer 150, the layer 150 all the same serves as a stop layer. This is because the rate of etching of the material of the layer 150 is less than that of the porous dielectric material of the layer 140, in particular because of the porosity of this layer 140. According to one embodiment, to etch the stop layer 150 made for example from silicon carbide (SiCH), silicon nitride (SiN) or silicon carbonitride (SiCN). In a preferred embodiment, the etching of this layer 150 is carried out by means of a traditional fluorocarbon chemistry. The etching of the layer 150 is preferably carried out in the same plasma etcher as that of the layer of porous dielectric material. The layer of porous dielectric material 140 of p-SiOCH is, in this case, always protected from any contamination by the protective layer 150 which was formed during the previous etching step. It is therefore not altered as in the conventional method.

The etching of the layer 130 of oxide, the layer of porous dielectric material 140 and the stop layer 150 stops advantageously on the metal material 180 forming a metal line of a first level N−1. Because of the presence of the protective layer 115, the etching is done without any modification to the layer of porous dielectric material 140.

Preferentially a plasma etcher of the ICP or CCP type is used. Advantageously, the same equipment is used as for the etching of the layers of oxide 130, porous dielectric material 140 and stop material 150. The advantageous ranges of values of the conditions for implementation of this etching are summarised in the following table, without the invention being limited to these values:

| | |
|---|---|
| $CH_4$ flow rate | 5-30 sccm (cubic centimeters per minute under standard pressure and temperature conditions) |
| $N_2$ flow rate | 50-200 sccm |
| Bias power (control of ion energy) | 100 watts-300 watts |
| Power of the source | Depends on the dissociation of the plasma |
| Pressure | 5-100 milliTorr |
| Temperature | 40°-100° C. |

According to the previous embodiment, the porosity of the dielectric material 140 is 25%.

The etching of the layer of porous dielectric material 140 is based on the fact that the porous SiOCH is etched following the bombardment of the ions generated by the plasma while the protective layer 115, made from hydrocarbon, is created spontaneously on the flanks and bottom of the trench 112. The protective layer 115 is formed with a limited modification of the material constituting the layer of porous dielectric material 140.

The thickness of the protective layer 115, which typically lies in a range of values from 1 to 5 nm and preferably lying between 1 and 2 nm can be adjusted by acting on the parameters of the plasma during etching.

The important parameters controlling the formation of the passivation layer are: the $C_xH_y/N_2$ ratio, the source power and the bias power that make it possible to control the dissociation rate and the energy of the ions, respectively, in a CCP or ICP reactor.

An excessively high concentration of methane ($CH_4$) could cause stoppage of the etching. Conversely, an insufficient concentration of methane would not make it possible to form a protective layer 115 necessary for protecting the flanks of the trenches 110. Moreover, during the ion bombardment, the energy of the ions must be sufficiently high (preferably between 100 Wb and 300 Wb) to prevent the carbon being deposited at the bottom of the trenches 110 while allowing etching of the porous dielectric material 140. However, an excessively high concentration of the ion energy could cause sputtering of the TiN-based hard mask, inevitably causing a stoppage of the etching. With regard to the temperature required during the plasma etching, a temperature of between 40° and 100° C. is favoured so as to avoid, at excessively low temperatures (typically below 40° C.), an additional deposition of metal (for example TiN) contained in the hard mask 120, which might subsequently cause problems of surface roughness as well as stoppage of the etching.

According to a preferential embodiment, the etching of the layer of porous dielectric material is carried out by means of a fluorine-free chemistry such as a gaseous mixture based on methane ($CH_4$) and nitrogen ($N_2$). The role of the nitrogen ($N_2$) is to etch the film of porous SiOCH. The problem is that, if we use only nitrogen ($N_2$), the risk is modifying the flank following the ion bombardment. Consequently the role of the methane ($CH_4$) is to protect the lateral wall (composed of a layer of carbon). The problem is that, if we use only methane $CH_4$, the risk is not being in a position to etch the film of porous SiOCH (stoppage of etching) because of the deposition of an excessively thick layer of carbon. An addition of nitrogen ($N_2$) also makes it possible to control the deposition of carbon C and by this means to find a compromise between the sputtering etching bottom line and the lateral protection with a layer of carbon on the flank. The nitrogen also makes it possible to avoid an excessively great deposition of polymers. According to a particular advantageous embodiment, the gas ratio between methane and nitrogen must be between 1:20 and 1:10. The risk of using a methane/nitrogen gaseous mixture ratio higher than 1:10 is preventing the etching of the porous dielectric material 140. The risk of using a methane/nitrogen gaseous mixture ratio less than 1:20 is modifying the porous dielectric material 140.

Other gases could be suitable for replacing nitrogen ($N_2$); such is the case with oxygen ($O_2$) for example. However, oxygen ($O_2$) could cause significant damage to the layer of porous dielectric material (140) such as a modification to the flanks or an increase in the dielectric constant. The addition of oxygen must therefore be in a small quantity, in an optimised ratio, in order to limit any deterioration of the porous dielectric material 140.

The above etching step is followed by a wet cleaning step. Advantageously, this cleaning step does not consume the protective layer 115 formed on the flanks of the trench 112 so as to avoid modification to the layer of porous dielectric material 140.

Figure 3F:
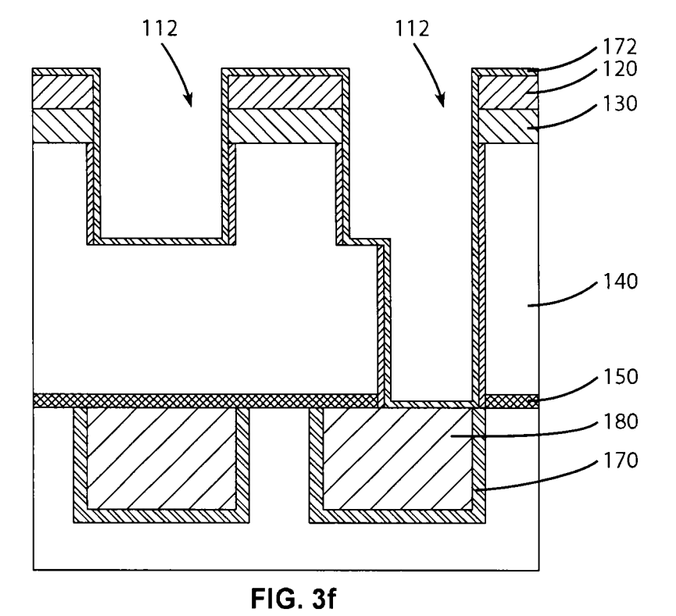

FIG. 3f illustrates the formation of an antidiffusion layer 172. This antidiffusion layer 172 is preferentially formed from a metal material. According to one example, this layer 172 comprises a stack of layers or a dual layer: a first layer made from a first material such as tantalum and a second layer made from a second material such as tantalum nitride. This antidiffusion layer 172 may be formed by a vapour deposition technique. Advantageously, the above wet cleaning step improves the metal contact between the metal antidiffusion layer 172 of a second level N and the metal material 180 forming a metal line of a first level N−1.

Figure 3G:
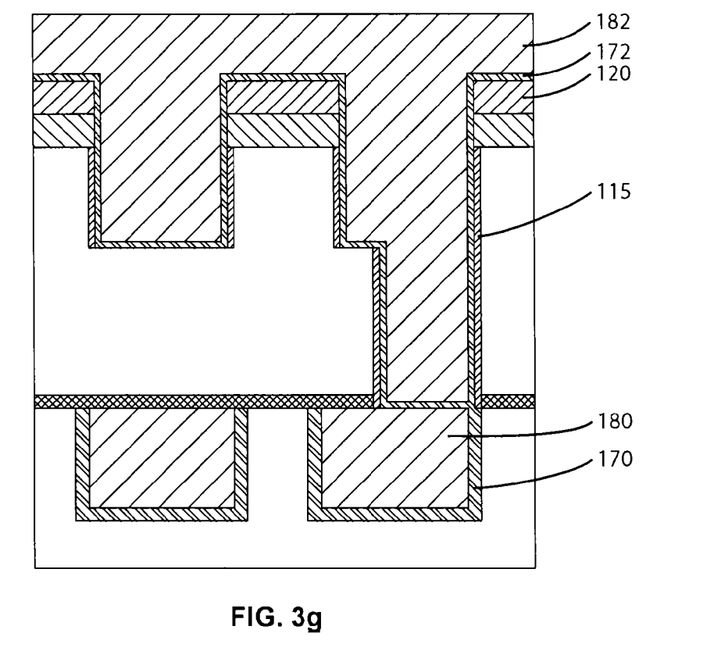

FIG. 3g illustrates the step of filling the trenches 112 with a layer 182 of metal material. The metal material of the layer 182 is preferentially copper.

According to a preferential embodiment, an inclination of the flanks of the trench 112 assists, during back-end of line operations, the obtaining of a satisfactory deposition firstly of the layer 172 forming a barrier to the diffusion of the metal material and secondly of the layer 182 of a metal material intended to fill the trenches 112 in order to form interconnection lines of the second level N.

Figure 3H:
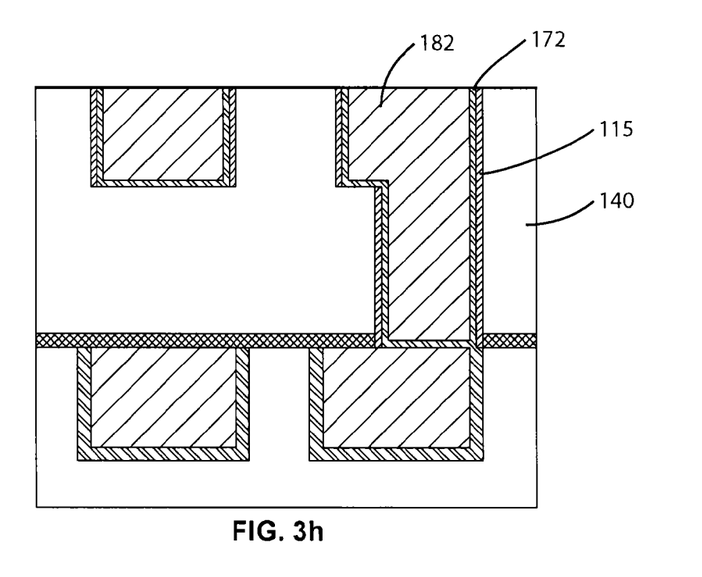

FIG. 3h illustrates a final step for producing interconnection lines comprising a partial removal of the layer 182 of a metal material. Preferentially, this partial removal comprises a chemical mechanical polishing. The chemical mechanical polishing of the layer 182 stops as soon as the layer of porous dielectric material 140 is detected.

According to a variant of the method of the invention, a metal hard mask 120 is not used; thus the steps 230 and 240 of FIG. 2 are omitted. The layered structure 100 that is deposited at step 210 therefore no longer comprises the layer 120 of titanium nitride (TiN). It is the layer 130, preferably, of silicon oxide that will then serve as a hard mask. In this variant of the method, the conditions for etching the layer of porous dielectric material 140, for example p-SiOCH, are the same as with the metal hard mask 120 and as described in FIGS. 3d and 3e. However, the etching differential between the layer of oxide 130 and the layer of porous dielectric material 140 p-SiOCH being less great than between the metal hard mask 120, for example of TiN, and the porous dielectric material 140, p-SiOCH, it is necessary to provide a greater consumption of the layer 130 of oxide during the etching and comply with a minimum ratio between the thickness of the layer of porous dielectric material 140 to be etched and the thickness of the layer of oxide 130. Typically, the thickness of the layer of oxide 130 will be greater than ⅕ of that of the layer of porous dielectric material 140. The thickness for each of these layers 130, 140 is measured in a direction perpendicular to the plane wherein the layers 130, 140 lie. In this variant of the method, the layer 130, which serves as a hard mask, can also be made from carbon (C) or silicon nitride (SiN).

Replacing the traditional etching of the layer of porous dielectric material 140 of p-SiOCH with a non-fluorinated etching advantageously makes it possible not to modify the flanks of the trenches 112 of porous dielectric material 140 during the etching, and not to form fluorinated residues that might possibly make unnecessary the wet cleaning step after the etching. In a standard method, these problems cause a drop in reliability of the devices produced. On the other hand, in the case of the invention, the hydrocarbon-based protective layer 115 protects the porous dielectric material 140 during the whole of the etching. Furthermore, this protective layer 115 acts as a diffusion barrier for the precursors. According to a particularly advantageous embodiment, an additional layer 172, for example of metal, is deposited on the protective layer 115 in order to form interconnection lines; the protective layer 115 advantageously remaining in place.

Moreover, the variant of the method wherein the use of a metal hard mask 120, preferably made from titanium nitride, is dispensed with, makes it possible to avoid numerous associated problems. The method, thus simplified, results in better productivity at lower cost.

The present invention is not limited to the embodiments described above but extends to any embodiment covered by the claims. Furthermore, the invention is not limited to a method for producing interconnection lines comprising at least one step of etching a layer of porous dielectric material intended to be etched for producing electrical interconnection lines but can apply to any method comprising any layer of porous dielectric material requiring an etching that causes only very little damage to the layer, or even none. The present invention may, for example, be used during a method for forming, by etching, spacers wherein the nitride is replaced by a porous dielectric material.

The invention claimed is:

1. A method for producing interconnection lines comprising at least one step of etching a layer of porous dielectric material forming a trench followed by a step of filling said trench; the etching is carried out in a plasma so as to grow, all along said etching, a protective layer at least on flanks of the layer of porous dielectric material, wherein the plasma is formed from a gas formed from a first component and a second component, or a gas formed from a first component, a second component and a third component, wherein:

the first component is a hydrocarbon of the $C_XH_Y$ type, where X is the proportion of carbon in the gas and Y the proportion of hydrogen (H) in the gas;

the second component is taken from nitrogen ($N_2$) or dioxygen ($O_2$) or a mixture of nitrogen and dioxygen;

the third component is taken from argon (Ar) or helium (He);

the ratio of gas between the first component and the second component is between 5% and 20%; and the protective layer is based on hydrocarbon.

2. The method according to claim 1, wherein the ratio of gas between the first component and the second component is greater than 1:20 and less than 1:10.

3. The method according to claim 1, wherein the hydrocarbon-based gas is methane (CH4).

4. The method according to claim 1, wherein, in order to adjust the thickness of the protective layer, the hydrocarbon concentration forming the plasma is modified.

5. The method according to claim 1, wherein the hydrocarbon-based protective layer formed during the etching electrically insulates the flanks of the porous dielectric material.

6. The method according to claim 1, wherein the protective layer formed during the etching is preserved.

7. The method according to claim 6, wherein an additional layer is deposited on the protective layer.

8. The method according to claim 1, wherein the porous dielectric material is a porous silicon oxide doped with carbon and hydrogen (SiOCH).

9. The method according to claim 1, comprising, before the etching of the layer of porous dielectric material, the production of a hard mask surmounting the layer of porous dielectric material, the hard mask having at least one pattern and the etching of the layer of porous dielectric material being performed through the hard mask in order to transfer the pattern into the layer of porous dielectric material.

10. The method according to claim 9, wherein the hard mask is made from silicon oxide ($SiO_2$), silicon nitride (SiN) or dense SiOCH.

11. The method according to claim 9, wherein the hard mask has a bottom face in contact with the layer of porous dielectric material and a top face opposite to the bottom face and wherein said top face is in contact with the etching plasma during the step of etching the layer of porous dielectric material through the hard mask.

12. The method according to claim 9, wherein the thickness of the hard mask is adapted so as not to be entirely consumed during the plasma etching of the layer of porous dielectric material.

13. The method according to claim 9, wherein the hard mask is a metal mask.

14. The method according to claim 9, wherein, prior to the definition of the pattern in the hard mask, a stop layer is disposed under the layer of porous dielectric material, conformed so as to stop the etching of the layer of porous dielectric material, and, after the step of etching the layer of porous dielectric material, a step of etching the stop layer is performed.

15. The method according to claim 9, wherein, prior to the definition of the pattern of the hard mask, there is disposed, under the layer of porous dielectric material, a stop layer which, when it is subjected to the plasma used for etching the layer of porous dielectric material, has an etching rate less than the etching rate of the layer of porous dielectric material, and wherein the stop layer is etched following the etching of the layer of porous dielectric material using said plasma.

16. The method according to claim 9, wherein the pattern is a trench, the method comprising, after the etching of the layer of porous dielectric material, a subsequent step of filling the trench with an electrically conductive material.

17. The method according to claim 16, wherein the trench forms an electrical interconnection line.

18. The method according to claim 1, wherein, before the etching step, the porous dielectric material covers a gate of a transistor and wherein the etching is performed anisotropically in a principal direction parallel to flanks of the gate, so as to remove the layer of porous dielectric material only outside the flanks of the transistor in order to form spacers for the gate.

19. The method according to claim 1, wherein the at least one step of etching the porous layer is performed without using fluorinated products.

* * * * *

UNITED STATES PATENT AND TRADEMARK OFFICE
CERTIFICATE OF CORRECTION

PATENT NO. : 9,679,802 B2
APPLICATION NO. : 14/661371
DATED : June 13, 2017
INVENTOR(S) : Nicolas Posseme It is certified that error appears in the above-identified patent and that said Letters Patent is hereby corrected as shown below:

On the Title Page

Item (73), the Assignee's information is incorrect. Item (73) should read:
--(73) Assignee: COMMISSARIAT A L'ENERGIE ATOMIQUE ET AUX ENERGIES ALTERNATIVES, Paris (FR)--

Signed and Sealed this
Tenth Day of April, 2018

Andrei Iancu
*Director of the United States Patent and Trademark Office*